US008021906B2

(12) United States Patent
Knechtel

(10) Patent No.: US 8,021,906 B2
(45) Date of Patent: Sep. 20, 2011

(54) HERMETIC SEALING AND ELECTRICAL CONTACTING OF A MICROELECTROMECHANICAL STRUCTURE, AND MICROSYSTEM (MEMS) PRODUCED THEREWITH

(75) Inventor: Roy Knechtel, Geraberg (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 74 days.

(21) Appl. No.: 12/438,824

(22) PCT Filed: Aug. 23, 2007

(86) PCT No.: PCT/EP2007/058788

§ 371 (c)(1),
(2), (4) Date: Dec. 14, 2009

(87) PCT Pub. No.: WO2008/025725

PCT Pub. Date: Mar. 6, 2008

(65) Prior Publication Data

US 2010/0096712 A1 Apr. 22, 2010

(30) Foreign Application Priority Data

Aug. 26, 2006 (DE) ......................... 10 2006 040 115

(51) Int. Cl.
*H01L 21/00* (2006.01)

(52) U.S. Cl. .............. 438/50; 438/51; 438/52; 257/414; 257/415; 257/416; 257/E21.613; 257/E29.324

(58) Field of Classification Search .................. 257/415, 257/414, 417, 418, E29.324, E21.613; 438/50, 438/51, 52
See application file for complete search history.

(56) References Cited

U.S. PATENT DOCUMENTS

| | | | |
|---|---|---|---|
| 4,925,024 A | 5/1990 | Ellenberger et al. | |
| 5,007,872 A | 4/1991 | Tang | |
| 6,225,145 B1 | 5/2001 | Choi et al. | |
| 6,891,711 B1 | 5/2005 | Kurtz | |
| 7,004,015 B2 * | 2/2006 | Chang-Chien et al. | 438/52 |
| 7,538,401 B2 * | 5/2009 | Eriksen et al. | 257/419 |
| 2005/0067688 A1 | 3/2005 | Humpston | |
| 2008/0029878 A1 | 2/2008 | Knechtel | |

FOREIGN PATENT DOCUMENTS

| | | |
|---|---|---|
| DE | 3837300 A1 | 5/1990 |
| EP | 1640333 A1 | 3/2006 |
| WO | 2005042401 A1 | 5/2005 |

OTHER PUBLICATIONS

M. Wiemer; Technological Development for Acceleration Sensors and Rotary Rate Sensors Using Wafer Bond Processes; Doctoral Thesis for obtaining the academic degree of Doktor-Ingenieur; Apr. 20, 1999; pp. 1-187 (with translation of pp. 110-113); document submitted in 2 parts.

* cited by examiner

*Primary Examiner* — Long K Tran
(74) *Attorney, Agent, or Firm* — Stevens & Showalter LLP

(57) ABSTRACT

Disclosed are methods and microsystems for vertically through-plating (6) cover plates (5) for microsystem components (2, 2*a*) by means of a conductive solder glass (8). Said methods and microsystems make it possible to simplify through-plating, reduce the failure rate, and increase reliability.

33 Claims, 1 Drawing Sheet

HERMETIC SEALING AND ELECTRICAL CONTACTING OF A MICROELECTROMECHANICAL STRUCTURE, AND MICROSYSTEM (MEMS) PRODUCED THEREWITH

BACKGROUND OF THE INVENTION

1. Field of the Invention

The invention relates to the production of microsystems with microelectromechanical structures, a vertical electrical throughplating of cover disks being used for the microelectromechanical structure.

2. Description of Related Art

In the silicon-based microsystem technology it is necessary in the production of microelectromechanical systems (MEMS) to protect the miniaturized, freely movable mechanical structures which are thus very sensitive to mechanical damage, humidity and corrosion and which are in contact with electrical components by means of a cover (typically silicon or glass). Mostly, its application already takes place in the wafer composite as an effective parallel joining process (wafer bonding), which, in addition, does not only offer a protection in the use during the service life, but also for the further processing (separation, assembly and connection technologies). As a rule, a defined atmosphere with a specific pressure is enclosed in the case of a hermetically sealed attachment of the cover, which is of importance for the function of the component. However, it must be ensured when covering the microelectromechanical structure that electric contact lines for the energy supply to the microelectromechanical system and the reading out of signals (e.g. sensor output signals) are guided into the hermetically sealed area and/or guided out of the same. As a rule, this is done by means of a horizontal leadthrough of conductor strips in the area of the connection point of system wafer and cover chip (and/or wafer). Here, the leadthroughs of conductor strips must be buried in an expensive fashion during direct and anodic bonding in order to obtain a plane sealing connection surface. During bonding with soft intermediate layers (glass solder bonding, adhesive bonding) metallic standard strip conductors can be embedded into the connection material in a hermetically sealed fashion. In both cases connecting faces (bond pads) of cover and system chip (and/or wafer) for the later wire bonding must be outside the cover in the connection plane.

This arrangement entails the following disadvantages:

1. The cover wafers must have large openings through which the connecting faces (in most cases a great number) are accessible. These openings can only be effectively made in the wafer composite prior to and after bonding, which, however, is always connected with a high expenditure (e.g. deep silicon etching, glass structuring).

However, the mechanical strength of the cover wafers is greatly reduced due to the openings so that they become susceptible to fractures. Consequently, the openings for the connecting faces cannot be dimensioned and arranged in an optional large size.

2. The connecting surfaces must imperatively be located next to the active microelectromechanical structures, i.e. additional space on the chip is required, whereby the integration density is limited and high costs are incurred. In extreme cases the connecting surfaces and the active microelectromechanical structures may have the same space requirements.

3. The connecting surfaces are not located on the chip surface as this is customary in the case of standard integrated circuits, but are lowered by the thickness of the cover. This renders the use of standard methods of the assembly and connection technologies (wire bonding) more difficult and/or makes the use of special technologies such as the flip-chip bonding very expensive or even impossible.

To overcome the disadvantages vertical throughplatings can be used in order guide an electric contact from the front side to the rear side through an opening in the cover wafer so that covered structures may be electrically connected. Various processes are known for the production of such throughplatings. Thus, the through holes can e.g. be completely filled with metals in chemical and/or electrochemical processes. Here, the special difficulty consists in ensuring a gas-tight filling. A method is known from literature, cf. Wiemer, Technologieentwicklung für Beschleunigungssensoren and Drehratensensoren unter Nutzung von Wafer-Bondverfahren, Dissertation April 1999, Chemnitz, in which the holes are only metallized on the side walls and their hermetically sealed closure is implemented by means of the bonded microcover.

All processes known so far are very expensive and, due to their lengthy individual processes (metal filling of the holes), they are very expensive and error-prone.

BRIEF SUMMARY OF THE INVENTION

The invention is based on the object of indicating a process and a microelectromechanical structure, the process of the throughplating being simplified in order to reduce the error rate and costs and to increase the reliability of the components.

In one aspect the object is attained according to the invention by a process for the hermetically sealed closing of a microelectromechanical structure. The process comprises the providing of a system wafer on which the microelectromechanical structure with a structured metallization layer with a pad is provided. Moreover, the process comprises the producing of a metallic strip conductor structure on the upper side of the cover wafer, a through hole area of the metallic strip conductor structure is aligned to a pad of the structured metallization layer, if the cover wafer is connected with its lower side with the system wafer. Moreover, a through hole is produced through the cover wafer at the through hole area in the process and a hermetically sealed closure for the microelectromechanical structure and an electrical contact between the metallic strip conductor structure and the structured metallization layer are produced by means of the sealing of the through hole with an electrically conductive glass solder paste.

Thus, the process according to the invention makes the contacting of the internal metallization layer of the MEM (microelectromechanical) structure possible by means of a vertical throughplating, which, in addition to the electrical connection, also provides for the gas-tight closure of the MEM structure. Thus, the process is simple to use and universally usable with a clear cost saving as compared with conventional techniques for the production of vertical throughplatings. The process of the throughplating can be easily integrated in the production process of microsystem technology components. Electrically conductive glass solders are mixtures of glass and metal powders in paste form, which are bonded in organic binding agents and which are commercially available. After the expulsion of the binding agent and the melting of the glass portion the metal particles form electrically conductive paths which conduct the electrical current very well and have a low ohmic resistance. Due to this, an electrical connection is established from the metallic strip conductor to the components of the MEM structure, wherein the metallic strip conductor structure may be structured in a suitable optional fashion in order to thus make the connection to the periphery such as to housings or printed circuit boards possible. Thus, a very efficient and space-saving wiring is possible since the space above the MEM structure can be used in order to provide the desired configuration of connection for the contacting of the periphery, the throughplating also ensuring the hermetic sealing of the space area without any further measures being required.

The producing of a hermetically sealed closure and an electric contact comprises in a further embodiment: connecting of the lower side of the cover wafer with a connection point on the system wafer, the connection point surrounding the structured metallization layer. Here, the connection point is preferably designed in such a way that all electrical connections required for the contactings of the MEM structure are located within the connection point. Thus, a hermetically sealed covering of the connection point is obtained so that during the hermetically sealed contacting of the metallization layer by means of the aforementioned process a finally complete tight covering is obtained.

The through hole is produced prior to the connecting of the lower side of the cover wafer with the connection point in a further embodiment. Thus, the working processes for the producing of the through holes may be separately implemented, due to which are certain independence between the production of the MEM structures and the production of the connections is established.

In a further embodiment the through hole is produced after the connection of the lower side of the cover wafer with the connection point. Thus, the process for connecting the two wafers can take place on the basis of an unstructured cover wafer, which, thus, has an increased stability and also a lesser susceptibility to producing contaminations on the system wafer during the connection.

In a further embodiment the production of a hermetically sealed closure and an electric connection comprises: filling in of an electrically conductive glass solder paste and carrying out of a heat treatment of a first type for fusing the glass solder paste. Standard processes and easily available materials can be used in this fashion, the fusing of the glass solder paste providing for the necessary conductivity and tightness. Here, the through hole must not be completely filled with the glass solder paste, but it is sufficient to tightly close the through hole so that then, optionally, other conductive materials may be inserted for completing the contact.

The heat treatment of the first type is carried out prior to the connecting of the lower side of the cover wafer with the connection point in a further embodiment so that a tight closure of the through hole is already made by working steps which are carried out independently of the system wafer. Then, the contacting is carried out upon the connecting of system wafer and cover wafer, here, as well, the already tight through hole providing both for the electrical contact and for the tightness (together with the connection point) of the MEM structure.

The process additionally comprises in a further embodiment: carrying out of a heat treatment of a second type for drying the glass solder paste prior to the carrying out of the heat treatment of the first type, and, in a variant, the heat treatment of the second type is carried out prior to the connection of the lower side of the cover wafer to the connection point and the heat treatment of the first type is carried out after the connection. Due to the heat treatment of the second type, i.e. the drying, which is carried out at lower temperatures as compared with the treatment of the first type, a better flexibility in the sequence can be achieved, since the glass solder paste can be used in further processes after the drying without negative effects due to the solder paste taking place.

The process additionally comprises in a further embodiment: carrying out of a further heat treatment of the first type. I.e. the solder paste is fused once more, whereby an efficient contacting of the metallization layer is obtained, if the paste had e.g. already been previously fused once for a higher thermal and mechanical stability.

The further heat treatment of the first type can be carried out prior to the connection and the heat treatment of the first type can be carried out after the connection of the lower side of the cover wafer and the connection point, wherein a very stable filling in the through hole is already present prior to the connection. A very reliable connection to the material located thereunder results with the further heat treatment and a reconfiguration can take place in the material of the contact through hole after the joining process.

In a further embodiment, the heat treatment of the first type is carried out in a joining process for connecting the lower side of the cover wafer with the connection point. I.e. the process temperature and the duration of the process are selected in the joining process so that the melting temperature of the paste is achieved or exceeded for the desired period of time so that, after the end of the joining process, both the electrical connection and the complete tightness are achieved.

The cover wafer comprises an insulating material in a further embodiment such as of glass so that the strip conductor structure can be produced on the cover wafer without any further measures.

In a further embodiment, the cover wafer comprises a conductive material and an insulating layer is formed at least on the upper side and the lower side prior to the production of the metallic strip conductor structure. Thus, a high degree of flexibility results in the selection of the material of the cover wafer so that process-related or component-specific circumstances can be taken into consideration. Silicon can e.g. be used as the base material for the cover wafer since very many processes for the structuring of Si are known, which can be used for the production of the through holes. Here, the insulating layer can be applied by all types of suitable processes such as chemical vapor deposition, etc., surface modification such as oxidation, nitration, etc. or combinations thereof.

In a further embodiment, the insulating layer is formed after the production of the through hole so that the insulating layer is also formed within the through hole in a single process and no further process steps are required after the production of the through hole for its insulation.

In a further embodiment, part of the insulating layer is formed on the lower side and the upper side prior to the forming of the through hole and the remainder of the insulating layer is formed on the side walls of the through hole after its formation. The strip conductor structure can be formed in this fashion on the cover wafer prior to the formation of the through hole in order to thus obtain a higher degree of process flexibility.

The insulating layer can be formed by depositing an insulating material and/or by means of a surface treatment of the conductive material of the cover wafer.

In a further embodiment, the electrically conductive glass solder paste is introduced into the through hole by means of a printing process as a screen printing or screen process printing, whereas, in other variants, the electrically conductive glass solder paste is introduced into the through hole by means of a metering process. Established processes and facilities for implementing these processes are available in this fashion so that hardly any additional investment costs are incurred.

In a further embodiment, two or more through holes are produced and provided for the electrical contacting and hermetic sealing for the microelectromechanical structure. With this, the required connections can be created for the MEM structure, the already mentioned advantages being achieved in view of the course of the process and the compactness of the formed contact structure. All required throughplatings can e.g. be disposed within the area of the chip surface which is occupied by the actual MEM structure, the strip conductor structure then providing for the necessary connection configuration to the periphery.

In a further embodiment the process additionally comprises: providing of connection contact in the metallic strip conductor structure and connecting of the microelectromechanical structure to a housing or an integrated circuit board by means of the connection contact, whereby the "rewiring" (adaptation of the connections of the MEM structure within the space area defined by the cover wafer and the connection point to a contact structure which allows a contacting of the periphery) is achieved.

Here, the connecting to a housing or an integrated circuit board can be effected by means of the bonding of a connection wire to the connection contact or by means of a direct connecting of the connection contact to a connection surface of the housing or the integrated circuit board.

According to a further aspect the aforementioned object is attained by a microsystem. The microsystem comprises a microelectromechanical structure (MEMS) with a structured metallization layer which is laterally enclosed by a connection point and a bonded cover wafer which is connected to the connection point and has a metallic strip conductor structure on the upper side. The microsystem additionally comprises a through hole which extends from a through hole area of the metallic strip conductor structure to a pad of the structured metallization layer through the bonded cover wafer and is filled with a fused electrically conductive glass solder for the establishing of an electrical contact between the metallic strip conductor structure and the structured metallization layer and for the hermetic sealing of the microelectromechanical structure. Thus, the microsystem according to the invention has electrical throughplatings which, at the same time, are hermetically sealed and are produced from an easily available and efficiently processable material.

In an advantageous embodiment the cover wafer comprises an insulating material.

In an advantageous embodiment the cover waver comprises a conductive material and an insulating layer at least on the upper side and the lower side and on the side walls of the through hole, the metallic strip conductor structure being formed on the insulating layer of the upper side.

In an advantageous embodiment the hole size and hole shape of the through hole are optionally designed within the framework of existing technological manufacturing processes for the through hole, in particular for the drilling of glass panes or KOH etching of silicon wafers, i.e. adapted to the component requirements within the framework of the technical possibilities. Thus, an optional shape and size which are considered to be advantageous for the respective component can be selected for the through hole.

In an advantageous embodiment several through holes are present per chip as a function of the chip size of the microsystem in order to provide several throughplatings so that all or at least a large portion of the electrical connections are efficiently guided out of the MEM structure.

In an advantageous embodiment the complete microsystem in the form of a chip is covered by the sawn cover wafer after sawing and there are all connections on the upper side of the sawn cover wafer, preferably directly on the microelectromechanical structure, and the throughplatings can be rewired by means of the metallic strip conductor structure on the upper side of the sawn cover wafer in such a way that a connection in surrounding housings or on integrated circuit boards is possible with standard processes of the assembly and connection technologies.

Further advantageous embodiments are revealed by the claims and the following detailed description.

BRIEF DESCRIPTION OF THE SEVERAL VIEWS OF THE DRAWINGS

The invention is explained and supplemented by means of examples with two semiconductor wafers with the aid of the drawing. In the drawings

DETAILED DESCRIPTION OF THE INVENTION

The "vertical" electrical throughplating of cover wafers for microsystem technical components is represented in each case, i.e. throughplatings to a conductor structure within the space area of a microelectromechanical structure, which is enclosed by the cover layer by means of connection points, by means of an electrically conductive glass solder which is located in the through holes of the cover wafer.

Figure 1:
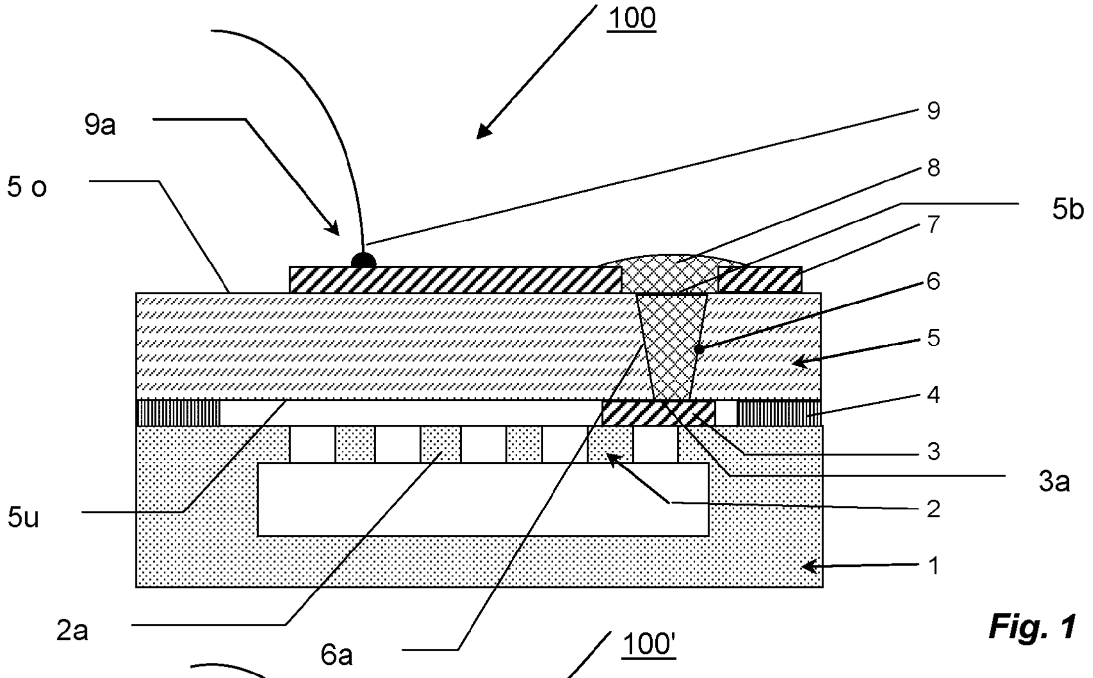
FIG. 1 shows, in a schematic representation, a longitudinal section through an example of the MEMS chip according to the invention with an insulating cover wafer.

A microsystem 100 is shown in FIG. 1 which is also provided in the represented embodiment in the form of a chip, if the microsystem 100 is in a production phase after the separation, while several systems 100 are provided on a single wafer prior to the separation. In the following the system and, if required, the chip are designated with the reference numeral 100. The microsystem 100 comprises a system wafer 1 on which a microelectromechanical structure 2 with freely movable structure components 2*a* which are to be protected is formed, which is covered by an insulating cover wafer 5 in FIG. 1, and, after the separation of the wafer stack to chips, the separated system wafer 1 and the separated cover wafer will have the same outer dimensions. The cover wafer 5 has an upper side 5*o* and a lower side 5*u* which is connected with the system wafer 1. The system wafer 1 and the cover wafer 5, i.e. its lower side 5*u* are connected with each other in a mechanically fixed and hermetically sealed fashion by means of a connection point 4 which laterally surrounds the structure 2. Here, the connection point 4 may be a compensating intermediate layer, e.g. glass solder, organic adhesive, or a direct connection such as a molecular or anodic bond connection. A through hole 6 or also several through holes (not shown) is (are) located in the cover wafer 5 above a structured metallization layer or metal structure 3 which is electrically connected with components 2*a* of the microelectromechanical structure 2 and which is formed on the system wafer 1. There is a second metal structure 7 on the upper side 5*o* of the cover wafer 5, which, on the one hand, encloses the through hole 6 and, on the other hand, permits a lateral rewiring on the cover wafer 5. An area 5*b* of the upper side 5*a* of the cover wafer 5 is a throughplating point for the through hole 6 and establishes a contact in the strip conductor structure 5 to one or more strip conductors which, in turn, are connected with correspondingly designed connection elements 9*a*, which make a contacting by peripheral components such as housings, integrated circuit boards and the like possible. The connection elements 9*a* can e.g. be designed for the contacting with a connection wire 9, which can be drawn to a surrounding housing. Alternatively to this, however, a direct soldering or connecting of the connection element 9*a* of the chip provided with a cover on integrated circuit boards is possible (flip-chip technology, ball-grid arrays), since the final connection metallization structure, the strip conductor structure 5 and the connection elements 9*a* are located on the upper side 5*o* of the cover. In order to implement the contacting of the metal of the system wafer 1, i.e. of the metallization layer 3, to the metal of the cover wafer 5, the strip conductor structure 7, the hole 6 must be filled with an electrically conductive glass solder paste 8 which, after its fusing, forms a conductive, low-ohmic path between both metal structures 3, 7 and, at the same time, closes the hole in a hermetically sealed fashion. For this purpose it is not imperative that the hole 6 is completely filled with conductive glass solder. The contact must only be ensured across part of the side surface of the casing and the sealing at the bottom of the hole. Thus, no special requirements must be met by the shape and size of the hole. Basically, holes with vertical and inclined side walls, side walls being larger or smaller than 90°, can be filled, a conical hole with a smaller opening at the connection point 4 being the most favorable solution in technological respect, since it can be filled very easily and the angle of the side walls in the openings is favorable for the wetting with the glass solder and, thus, for the contact. The hole 6 and/or the several holes may be both round or rectangular or have a different shape which is compatible with the technological possibilities of the respective processes for producing the hole.

Figure 2:
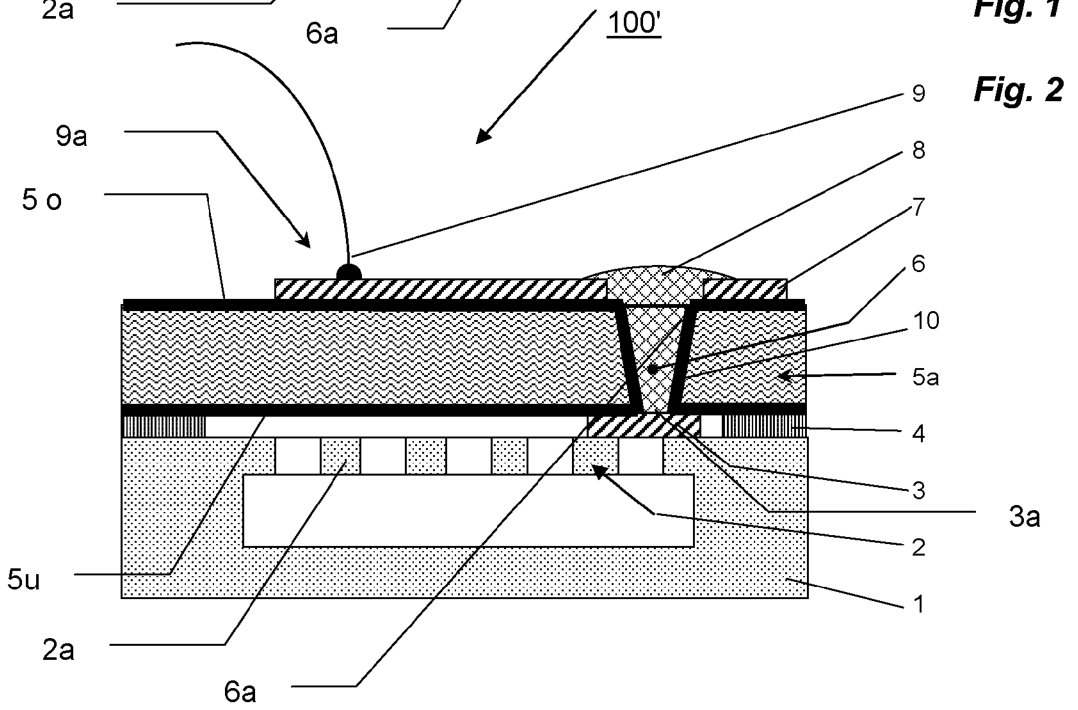
FIG. 2 shows, in a schematic representation, a longitudinal section through an example of the MEMS chip according to the invention with a conductive insulating cover.

An analogous arrangement of the microsystem 100 is shown in FIG. 2, in which a cover and/or a cover wafer 5*a* is/are conductive and is/are e.g. made of a semiconductor material, e.g. silicon. Here, it is necessary that all electrically conductive structures of the strip conductor structure 7 of a different potential are insulated with respect to each other on the cover wafer 5*a*. For this purpose, the conductive cover must be covered on both sides with an insulating layer 10, which also lines the hole 6; the insulating layer 10 is also formed on side walls 6*a* of the hole 6. This insulating layer 10 may be produced with standard semiconductor processes such as thermal oxidation, CVD (chemical vapor deposition) with silicon oxide or silicon nitride, surface treatments such as nitration in the case of semiconductor cover wafers, preferably made of silicon. After the application of this insulating layer the electrically conductive cover wafers 5*a* behave exactly in the same fashion as the insulating cover wafers 5 that were described above as regards the throughplating.

The production of the microsystem 100 comprises the following steps. After the production of the MEM structure 2 with the components 2*a*, the metallization layer 3 and the connection point 4 on the basis of established processes the cover wafer 5, 5*a* is prepared. In one embodiment it is made available as an insulating material which can then be further processed, e.g. the strip conductor structure 7 is produced and the cover wafer 5 is connected with the system wafer 1 by means of a joining process, when the throughplatings are to be produced in the form of through holes 6 on the basis of a wafer composite. The cover wafer 5 is processed separately to the wafer 1 in other cases in order to first of all produce the through hole 6 by means of drilling, etching, etc. in the area 5*b* of the upper side 5*o*, the strip conductor structure 7 being formed previously. Thereafter, the filling of the conductive glass solder paste 8 is implemented, which may take place by means of printing processes in the screen printing or screen process printing or by means of metering processes. In other embodiments the filling of the hole 6 is carried out after the connecting of the lower side 5*u* to the connection point 4, if the process conditions during the joining process are not compatible with the material properties of the paste 8. If the paste 8 is filled in prior to the joining process, it is subjected to a heat treatment for melting the paste in a variant, this type of heat treatment being also designated as a first type of heat treatment in the following. For this purpose, a temperature ranging from 200 to 500° C. is used for a duration of about 10 to 300 seconds. Due to the fusing of the paste 8 the binding agent components and other volatile components are expelled and the electrical properties and the sealing properties are maintained. In other embodiments a heat treatment for drying the paste 8 is first of all carried out, which is also designated as a heat treatment of the second type in the following, temperatures that are lower than in the heat treatment of the first type being used in order to certainly expel volatile components and to achieve a higher thermal and mechanical stability of the paste for the further processing but without bringing about a melting process.

The melting can be carried out after the joining process if the process temperatures involved therein are below the melting temperature. In other cases, a first melting process is already carried out prior to the joining process and, after the connection, a further melting process is carried out so that, after the first melting process, a high thermal and mechanical loadability of the paste 8 results, but after the connection the electric contacting is reliably implemented with a further heat treatment of the first type, wherewith an improvement of the tightness can also be achieved.

In other embodiments the heat treatment of the first type is carried out during the joining process so that a very efficient process sequence results. For this purpose, the process parameters are adjusted in such a way in the joining process that the paste 8 is brought to or above the melting temperature for the required duration of time. Subsequently, the strip conductor structure 7 can be connected to the periphery, i.e. to a housing, an integrated circuit board or another support via the connection elements 9*a* by means of bonding, flip-chip contacting and the like.

As already suggested above all processing steps for the production of the strip conductor structure, the through holes 6 and the filling of the holes 6 may also be carried out in the wafer composite, i.e. when the wafers 1 and 5 are already connected to each other.

Similar criteria as for the embodiments of FIG. 1 apply to the embodiments of FIG. 2, however, the insulating layer 10 must be applied to the side walls 6*a* prior to the filling of the holes. For this purpose, the insulating layer may be applied to the upper side 5*o*, the lower side 5*u* and the side walls in a combined process after the making of the holes 6, which is followed by the making of the strip conductor structure 7. The aforementioned processes can be used for the making of the insulating layer 10. In other variants the insulating layer 10 can at first be made on the upper side 5*o* and the lower side 5*u*, which is followed by the production of the strip conductor structure 7. After the structuring of the holes 6 their side walls 6*a* can then be provided with the insulating layer 10, if a passivation of the strip conductor structure 7 is e.g. also desired. Then, after the production of the insulating layer, the further processing can be implemented in the way described above with reference to FIG. 1.

In one embodiment the production process corresponds to a process for closing the microelectromechanical structure 2 in an hermetically sealed fashion, which is located on the system wafer 1, with the cover wafer 5 consisting of insulating material for the purpose of the production of a microelectromechanical system 100, in which vertically extending through holes 6 are made in the cover wafer 5 in order to connect the microelectromechanical structure 2 which is to be closed in a hermetically sealed fashion to the metallic strip conductor structure 7 on the upper side 5*o* of the cover wafer 5 by means of a conductive connection through the through holes 6, wherein, at first, the metallic strip conductor structure 7 is formed on the upper side 5*o* of the cover wafer 5, areas 5*b* being kept free from metal in the metallic strip conductor structure 7 which are allocated to the pads 3*a* on the structured metallization layer 3 of the system wafer 1, at which the electric contact is produced at a later point in time and, then, the through holes 6 are made in these areas and, subsequently, the system wafer 1 and the cover wafer 5 are joined and, thereafter, electrically conductive glass solder paste 8 is introduced into the through holes 6 and, for closing the microelectromechanical structure 2, the glass paste is fused, a sealing taking place and the electrical contact between the structured metallization layer 3 and the metallic strip conductor structure 7 being established.

In one embodiment the production process corresponds to a process for the hermetically sealed closing of the microelectromechanical structure 2 which is located on the system wafer 1 with a cover wafer 5 consisting of insulating material for the purpose of the production of a microelectromechanical system 100, in which vertically extending through holes 6 are made in the cover wafer 5 in order to connect the microelectromechanical structure 2 to be closed in a hermetically sealed fashion to the metallic strip conductor structure 7 on the upper side 5*o* of the cover wafer 5 through the through holes 6 by means of a conductive connection, wherein the metallic strip conductor structure 7 is first of all formed on the upper side 5*o* of the cover wafer 5, areas 5*b* being kept free from metal in the metallic strip conductor structure 7, which are allocated to the pads 3*a* on the structured metallization layer 3 of the system wafer 1, on which the electrical contact is made at a later point in time and, thereafter, the through holes 6 are made in these areas and, subsequently, electrically conductive glass solder paste 8 is introduced into the through holes 6 and molten, whereby the holes 6 are sealed, the system wafer 1 and the cover wafer 5 are subsequently joined, due to which the closure of the microelectromechanical structure 2 takes place and the electrical contact is established between the structured metallization layer 3 and the metallic strip conductor structure 7.

In a further embodiment the production process corresponds to a process for the hermetically sealed closing of the microelectromechanical structure 2 which is located on the system wafer 1 with a cover wafer 5 consisting of insulating material for the purpose of the production of a microelectromechanical system 100, in which vertically extending through holes 6 are made in the cover wafer 5 in order to connect the microelectromechanical structure 2 to be closed in a hermetically sealed fashion to the metallic strip conductor structure 7 on the upper side 5*o* of the cover wafer 5 through the through holes 6 by means of a conductive connection, wherein, at first, the metallic strip conductor structure 7 is formed on the upper side 5*o* of the cover wafer 5, areas 5*b* being kept free from metal in the metallic strip conductor structure 7, which are allocated to the pads 3*a* on the structured metallization layer 3 of the system wafer 1, on which the electrical contact is established at a later point in time and, thereafter, the through holes 6 are made in these areas and, subsequently electrically conductive glass solder paste 8 is introduced into the through holes 6 and dried, thereafter the system wafer 1 and the cover wafer 5 are joined and the pre-dried glass solder is fused, the closure of the microelectromechanical structure 2 taking place and the electrical contact between the structured metallization layer 3 and the metallic strip conductor structure 7 being established.

In a still further embodiment the production process corresponds to a process for the hermetically sealed closing of the microelectromechanical structure 2 which is located on the system wafer 1 with a cover wafer 5 consisting of insulating material for the purpose of the production of a microelectromechanical system 100, in which vertically extending through holes 6 are made in the cover wafer 5 in order to connect the microelectromechanical structure 2 which is to be closed in a hermetically sealed fashion to the metallic strip conductor structure 7 on the upper side 5*o* of the cover wafer 5 through the through holes 6 by means of a conductive connection, wherein, first of all, the metallic strip conductor structure 7 is formed on the upper side 5*o* of the cover wafer 5, areas 5*b* being kept free from metal in the metallic strip conductor structure 7, which are allocated to the pads 3*a* on the structured metallization layer 3 of the system wafer 1, on which the electrical contact is to be established at a later point in time, and, thereafter, the through holes 6 are made in these areas and, subsequently, electrically conductive glass solder paste 8 is introduced into the through holes 6 and dried and pre-molten, thereafter the system wafer 1 and the cover wafer 5 are joined and the pre-molten glass solder is fused a second time, wherein the closure of the microelectromechanical structure 2 takes place and the electrical contact is established between the structured metallization layer 3 and the metallic strip conductor structure 7.

In one embodiment the production process corresponds to a process for the hermetically sealed closing of the microelectromechanical structure 2 which is located on the system wafer 1, which comprises a cover wafer 5*a* consisting of electrically conductive material for the purpose of the production of a microelectromechanical system 100, in which vertically extending through holes 6 are made in the cover wafer 5*a* in order to connect the microelectromechanical structure 2 which is to be closed in a hermetically sealed fashion to the metallic strip conductor structure 7 on the upper side 5*o* of the cover wafer 5*a* through the through holes 6 by means of a conductive connection, wherein the through holes 6, first of all, are made in the cover wafer in areas 5*b* which are allocated to the pads 3*a* on the structured metallization layer 3 of the system wafer 1, at which the electrical contact is established at a later point in time, thereafter the cover wafer 5*a* is oxidized and then a metallic strip conductor 7 is formed on the upper side 5*o* of the cover wafer 5*a*, the holes 6 being kept free from metal in the metallic strip conductor structure 7 and, subsequently, the system wafer 1 and the cover wafer 5*a* are joined and, thereafter, an electrically conductive glass solder paste 8 is introduced into the through holes 6 and, for the closure of the microelectromechanical structure 2, the glass paste is fused, the sealing taking place and the electrical contact between the structured metallization layer 3 and the metallic strip conductor structure 7 being established.

In one embodiment the production process corresponds to a process for the hermetically sealed closing of the microelectromechanical structure 2 which is located on the system wafer 1 with a cover wafer 5*a* consisting of electrically conductive material for the purpose of the production of a microelectromechanical system 100, wherein vertically extending through holes 6 are made in the cover wafer 5*a* in order to connect the microelectromechanical structure 2 to be closed in a hermetically sealed fashion to the metallic strip conductor structure 7 on the upper side 5*o* of the cover wafer 5*a* through the through holes 6 by means of a conductive connection, wherein the through holes 6 are first of all made in the cover wafer at areas 5*b* which are allocated to the pads 3*a* on the structured metallization layer 3 of the system wafer 1, at which the electrical contact is made at a later point in time, thereafter the cover wafer 5*a* is oxidized and then a metallic strip conductor structure 7 is formed on the upper side 5*o* of the cover wafer 5*a*, the holes 6 being kept free from metal in the metallic strip conductor structure 7 and, subsequently, electrically conductive glass solder paste 8 being introduced into the through holes 6 and being molten, whereby the through holes 6 are sealed, the system wafer 1 and the cover wafer 5*a* being subsequently joined, the closure of the microelectromechanical structure 2 taking place and the electrical contact being established between the structured metallization layer 3 and the metallic strip conductor structure 7.

In a still further embodiment the production process corresponds to a process for the hermetically sealed closing of the microelectromechanical structure 2 which is located on the system wafer 1 with a cover wafer 5*a* consisting of electrically conductive material for the purpose of the production of a microelectromechanical system 100, wherein vertically extending through holes 6 are made in the cover wafer 5*a* in order to connect the microelectromechanical structure 2 to be closed in a hermetically sealed fashion to the metallic strip conductor structure 7 on the upper side 5*o* of the cover wafer 5*a* through the through holes 6 by means of a conductive connection, wherein the through holes 6 are first of all made in the cover wafer at areas 5*b* which are allocated to the pads 3*a* on the structured metallization layer 3 of the system wafer 1, at which the electrical contact is made at a later point in time, thereafter the cover wafer 5*a* is oxidized and then a metallic strip conductor structure 7 is formed on the upper side 5*o* of the cover wafer 5*a*, the holes 6 being kept free from metal in the metallic strip conductor structure 7 and, subsequently, electrically conductive glass solder paste 8 being introduced into the through holes 6 and being dried, the system wafer 1 and the cover wafer 5*a* being subsequently joined and the pre-dried glass solder being fused, the closure of the microelectromechanical structure 2 taking place and the electrical contact being established between the structured metallization layer 3 and the metallic strip conductor structure 7.

In a still further embodiment the production process corresponds to a process for the hermetically sealed closing of the microelectromechanical structure 2 which is located on the system wafer 1 with a cover wafer 5*a* consisting of electrically conductive material for the purpose of the production of a microelectromechanical system 100, wherein vertically extending through holes 6 are made in the cover wafer 5*a* in order to connect the microelectromechanical structure 2 to be closed in a hermetically sealed fashion to the metallic strip conductor structure 7 on the upper side 5*o* of the cover wafer 5*a* through the through holes 6 by means of a conductive connection, wherein the through holes 6 are first of all made in the cover wafer at areas 5*b* which are allocated to the pads 3*a* on the structured metallization layer 3 of the system wafer 1, at which the electrical contact is made at a later point in time, thereafter the cover wafer 5*a* is oxidized and then a metallic strip conductor structure 7 is formed on the upper side 5*o* of the cover wafer 5*a*, the holes 6 being kept free from metal in the metallic strip conductor structure 7 and, subsequently, electrically conductive glass solder paste 8 being introduced into the through holes 6, being dried and pre-molten, the system wafer 1 and the cover wafer 5*a* being subsequently joined and the pre-molten glass solder being fused a second time, the closure of the microelectromechanical structure 2 taking place and the electrical contact being established between the structured metallization layer 3 and the metallic strip conductor structure 7.

A further embodiment relates to an arrangement of a microelectromechanical structure (MEMS), in which a microelectromechanical structure 2 is covered by a bonded cover wafer 5 consisting of an insulating material, which comprises through holes 6 which reach into the space, in which the micromechanical structure 2 is located and which are filled with a fused, electrically conductive glass solder 8, whereby, on the one hand, electrical contacts between the structured metallization layer 3 of the microelectromechanical structure 2 on the system wafer 1 and a metallic strip conductor structure 7 for bond contacts on the surface 5*o* of the cover wafer 5 are established and, on the other hand, the microelectromechanical structure 2 is closed in a hermetically sealed fashion.

A further embodiment relates to an arrangement of a microelectromechanical structure (MEMS), in which a microelectromechanical structure 2 is covered by a bonded cover wafer 5*a* consisting of a conductive material coated with an insulating layer 10, which comprises through holes 6 which are insulated by the insulating layer 10 and which reach into the space, in which the micromechanical structure 2 is located and which are filled with a fused, electrically conductive glass solder 8, whereby, on the one hand, electrical contacts between the structured metallization layer 3 of the microelectromechanical structure 2 on the system wafer 1 and a metallic strip conductor structure 7 for bond contacts on the surface 5*o* of the cover wafer 5 are established and, on the other hand, the microelectromechanical structure 2 is closed in a hermetically sealed fashion.

REFERENCE NUMERALS

The Same Designations are Used for the Same Elements in Different FIGS.

1: system wafer
2 microelectromechanical structure to be covered
2*a* components of the microelectromechanical structure
3 structured metallization layer on the system wafer
3*a* pads in the metallization layer 3
4 connection point of the hermetic connection between system wafer and cover wafer
5 cover wafer—insulator
5*a* cover wafer—semiconductor or conductor
5*b* area for making the through hole
5*o* upper side of the cover wafer 5, 5*a*
5*u* lower side of the cover wafer 5, 5*a*
6 through hole in the cover wafer
6*a* side wall of the through hole
7 metallization of cover wafer—rewiring
8 electrically conductive glass solder
9 connection wire
9*a* connection element
10 insulation layer of the cover wafer 5*a*
100
100' microsystem with the microelectromechanical structure with the several components 2*a*

The invention claimed is:

1. A process for hermetically sealed closing of a microelectromechanical structure (2) comprising the steps of:

providing a system wafer (1) on which the microelectromechanical structure (2) with a structured metallization layer (3) with a pad is provided;

providing a cover wafer (5; 5*a*) having a conductive material, wherein an insulating layer (10) is formed at least on an upper side and a lower side of the cover wafer (5; 5*a*);

producing a through hole (6) through the cover wafer (5; 5*a*);

producing a metallic strip conductor structure (7) on the upper side of the cover wafer (5; 5*a*), wherein a through hole area of the metallic strip conductor structure (7) is aligned with the pad of the structured metallization layer (3), if the cover wafer (5; 5*a*) is connected to a side of the system wafer (1);

wherein at least a part of the insulating layer (10) is formed after producing the through hole (6) such that the insulating layer (10) also lines at least one side wall of the through hole (10); and producing a hermetically sealed closure for the microelectromechanical structure (2) and an electrical contact between the metallic strip conductor structure (7) and the structured metallization layer (3) by sealing the through hole (6) with an electrically conductive glass solder paste.

2. The process according to claim 1, wherein the producing of a hermetically sealed closure and an electrical contact comprises: connecting the lower side of the cover wafer (5, 5*a*) to a connection point (4) on the system wafer (1) which surrounds the structured metallization layer (3).

3. The process according to claim 2, wherein the through hole (6) is produced prior to connecting the lower side of the cover wafer (5; 5*a*) to the connection point (4).

4. The process according to claim 2, wherein the through hole (6) is produced after connecting the lower side of the cover wafer (5; 5*a*) to the connection point (4).

5. The process according to claim 1, wherein the producing of the hermetically sealed closure and the electric connection comprises: filling in the electrically conductive glass solder paste (8) and carrying out a heat treatment of a first type for fusing the glass solder paste.

6. The process according to claim 5, wherein the heat treatment of the first type is carried out during a joining process for connecting the lower side of the cover wafer (5; 5*a*) to a connection point (4) on the system wafer (1) which surrounds the structured metallization layer (3).

7. The process according to claim 5, wherein the heat treatment of the first type is carried out prior to connecting the lower side of the cover wafer (5; 5*a*) to a connection point (4) on the system wafer (1) which surrounds the structured metallization layer (3).

8. The process according to claim 5 further comprising: carrying out of a heat treatment of a second type for drying the glass solder paste (8) prior to carrying out the heat treatment of the first type.

9. The process according to claim 8, wherein the heat treatment of the second type is carried out prior to connecting the lower side of the cover wafer (5; 5*a*) to a connection point (4) on the system wafer (1) which surrounds the structured metallization layer (3) and the heat treatment of the first type is carried out after the connecting.

10. The process according to claim 8 further comprising: carrying out of a further heat treatment of the first type.

11. The process according to claim 10, wherein the further heat treatment of the first type is carried out prior to the connecting and the heat treatment of the first type is carried out after the connecting of the lower side of the cover wafer (5; 5*a*) and a connection point (4) on the system wafer (1) which surrounds the structured metallization layer (3).

12. The process according to claim 1, wherein the cover wafer (5; 5*a*) comprises an insulating material.

13. The process according to claim 1, wherein the cover wafer (5; 5*a*) is completely made from conductive material and the insulating layer (10) is formed at least on the upper side and the lower side prior to the producing of the metallic strip conductor structure (7).

14. The process according to claim 1, wherein a part of the insulating layer (10) is formed on the lower side and the upper side prior to the making of the through hole and the remainder of the insulating layer is formed on the side walls of the through hole after its making.

15. The process according to claim 1, wherein the insulating layer (10) is formed by depositing an insulating material.

16. The process according to claim 1, wherein the insulating layer (10) is formed by means of a surface treatment of the conductive material of the cover wafer (5; 5*a*).

17. The process according to claim 1, wherein the electrically conductive glass solder paste (8) is introduced into the through hole (6) by means of a printing process as a screen printing or screen process printing.

18. The process according to claim 1, wherein the electrically conductive glass solder paste (8) is introduced into the through hole by means of a metering process.

19. The process according to claim 1, wherein two or more through holes (6) are made and provided for the electric contacting and hermetic sealing for the microelectromechanical structure (2).

20. The process according to claim 1, further comprising: providing of a connection contact (9) in the metallic strip conductor structure (7) and connecting the microelectromechanical structure (2) with a housing or an integrated circuit board by means of the connection contact.

21. The process according to claim 20, wherein the connecting with a housing or an integrated circuit board takes place by means of bonding of a connection wire to the connection contact.

22. The process according to claim 21, wherein the connecting with a housing or an integrated circuit board takes place by means of directly connecting the connection contact to a connection surface of the housing or the integrated circuit board.

23. A microsystem with a microelectromechanical structure (2) with a structured metallization layer (3) which is laterally enclosed by a connection point (4) and comprising:

a bonded cover wafer (5; 5*a*) which is connected to the connection point (4) and has a metallic strip conductor structure (7) on an upper side wherein the cover wafer (5, 5*a*) comprises a conductive material and an insulating layer (10) is provided on at least the upper side and a lower side of the cover wafer and on at least one side wall of at least one through hole, wherein the metallic strip conductor structure is formed on the insulating layer (10) on one side of the cover wafer;

the at least one through hole (6) extending from a through hole area of the metallic strip conductor structure (7) to a pad of the structured metallization layer (3) through the bonded cover wafer (5; 5*a*) and comprising a fused electrically conductive glass solder (8), establishing an electrical contact between the metallic strip conductor structure (7) and the structured metallization layer, with a hermetic sealing of the microelectromechanical structure (2).

24. The microsystem according to claim 23, wherein the cover wafer (5) comprises an insulating material.

25. The microsystem according to claim 23, wherein the insulating layer comprises an oxide of the conductive material of the cover wafer.

26. The microsystem according to claim 23, wherein a hole size and a hole shape of the at least one through hole (6) are designed within a framework of existing technological production processes for the through hole.

27. The microsystem according to claim 26, wherein the at least one through hole is drilled or KOH etched.

28. The microsystem according to claim 23, wherein several through holes are present as a function of the chip size of the microsystem to provide several throughplatings per chip.

29. The microsystem according to claim 28, wherein, after a sawing, the complete microsystem in the form of a chip is covered by the sawn cover wafer (5; 5*a*) and all connections are located on the upper side of the sawn cover wafer (5; 5*a*) and the throughplatings (8) can be rewired by means of the metallic strip conductor structure (7) on the upper side of the sawn cover wafer (5; 5*a*) so that a connection in surrounding housings or on integrated circuit boards is possible with standard processes of the assembly and connection technologies.

30. The microsystem according to claim 29, wherein all connections are directly above the micromechanical structure.

31. A process for the hermetically sealed vertical electrical throughplating of cover wafers comprising insulating material, providing a system wafer (1) supporting a micromechanical structure (2) and a cover wafer (5; 5*a*), wherein vertically extending through holes (6) are provided in the cover wafer (5) to connect the micromechanical structure (2) to metallization structures on an upper side of the cover wafer (5) through the through holes (6) by means of a conductive connection and providing the system wafer (1) with a structured metallization layer (3), applying a structured metallization (7) onto the cover wafer (5), allocating the through holes (6) to the metallization layer (3), joining the system wafer (1) and the cover wafer (5) and, thereafter, introducing electrically conductive glass solder paste (8) into the through holes (6) and fusing the glass solder paste to completely seal the entire through holes and to establish the electric contact.

32. The process according to claim 31, wherein the system wafer (1) is provided with the structured metallization layer (3), the metallization (7) is applied onto the cover wafer (5) and structured and the through holes are allocated to the metallization layer (3) and, subsequently, the electrically conductive glass solder paste (8) is introduced into the through holes (6) and molten in order to seal each hole.

33. A process for the hermetically sealed closing of a microelectromechanical structure comprising:
- providing a system wafer on which the microelectromechanical structure with a structured metallization layer with a pad is provided;
- producing a metallic strip conductor structure on the upper side of a cover wafer, wherein a through hole area of the metallic strip conductor structure is aligned with a pad of the structured metallization layer, if the cover wafer is connected to the lower side of the system wafer;
- producing a through hole through the cover wafer in or on the through hole area; and
- producing a hermetically sealed closure for the microelectromechanical structure and an electrical contact between the metallic strip conductor structure and the structured metallization layer by completely sealing the entire through hole with an electrically conductive glass solder paste by fusing the glass solder paste.

* * * * *